United States Patent [19]
Ditchek et al.

[11] Patent Number: 5,098,862
[45] Date of Patent: Mar. 24, 1992

[54] METHOD OF MAKING OHMIC ELECTRICAL CONTACT TO A MATRIX OF SEMICONDUCTOR MATERIAL

[75] Inventors: Brian M. Ditchek, Milford; Marvin Tabasky, Peabody, both of Mass.

[73] Assignee: GTE Laboratories Incorporated, Waltham, Mass.

[21] Appl. No.: 610,472

[22] Filed: Nov. 7, 1990

[51] Int. Cl.$^5$ .................. H01L 21/283; H01L 21/31
[52] U.S. Cl. .......................... 437/203; 437/67; 437/195; 437/200; 437/228; 437/48
[58] Field of Search .................. 437/203, 67, 113, 48, 437/51, 195, 200, 228, 78, 40; 148/DIG. 135, DIG. 19; 357/22, 45, 49, 55, 60

[56] References Cited

U.S. PATENT DOCUMENTS

| | | | |
|---|---|---|---|
| 4,482,907 | 11/1984 | Jay | 357/55 |
| 4,660,063 | 4/1987 | Anthony | 357/55 |
| 4,724,223 | 2/1988 | Ditchek | 437/200 |
| 4,800,417 | 1/1989 | Kato | 357/49 |
| 4,829,173 | 5/1989 | Ditchek et al. | 250/211 |
| 4,845,051 | 7/1989 | Cogan et al. | 437/78 |
| 4,977,436 | 12/1990 | Tsuchiya et al. | 357/45 |

Primary Examiner—Brian E. Hearn
Assistant Examiner—T. N. Quach
Attorney, Agent, or Firm—Victor F. Lohmann, III

[57] ABSTRACT

Electrical ohmic contacts are made to a matrix of silicon having conductive rods embedded therein without making contact to any of the rods. Those rods which extend to the surface in the selected area of the matrix to be contacted are etched to form holes. The holes are filled with insulating polycrystalline silicon. The region of the selected area is heavily doped, and an ohmic contact member is made thereto. The underlying rods are spaced from the ohmic contact member and the heavily-doped region by intervening polycrystalline silicon.

18 Claims, 2 Drawing Sheets

METHOD OF MAKING OHMIC ELECTRICAL CONTACT TO A MATRIX OF SEMICONDUCTOR MATERIAL

This invention was made with Government support under Contract No. N00014-86-C-0595 awarded by the Department of the Navy. The Government has certain rights in this invention.

BACKGROUND OF THE INVENTION

This invention relates to semiconductor devices. More particularly, it is concerned with semiconductor devices having a body including a matrix of semiconductor material with rods of conductive material embedded therein, and to methods of making ohmic contact to the semiconductor material of the matrix.

Semiconductor devices employing semiconductor-metal eutectic composites which include a matrix of semiconductor material with an array of conductive rods disposed therein have been developed for uses as, for example, power field effect transistors, photodiodes, and photodiode arrays. Examples of such devices are illustrated in U.S. Pat. Nos. 4,724,223 to Ditchek and 4,829,173 to Ditchek et al, which patents are assigned to the assignee of the present invention. These and other semiconductor device structures employing semiconductor-metal eutectic composites require ohmic contacts to the semiconductor material of the matrix. Heretofore ohmic contacts to the surface of a semiconductor-metal eutectic composite body at which the ends of conductive rods were exposed also made ohmic contact to some of the rods in the composite. These rods, in effect, became part of the ohmic contact extending the contact through the wafer.

Under certain circumstances the inclusion of conductive rods as part of the ohmic contact to the semiconductor material has led to some undesired effects. Specifically, the rods in the eutectic composite, although generally parallel, frequently are misaligned to a small extent. This divergence causes variations in spacing between the rods which are part of the ohmic contact and other rods which are part of the gate electrode. The maximum blocking voltage of a transistor is determined by a "punch-through" mechanism, such that breakdown occurs when the depletion zone extends from the gate members to the ohmic contact at the drain. Therefore, if the spacing between the rods of the gate and the rods of the ohmic drain contact are reduced by divergence of the rods, the maximum blocking voltage which can be sustained before "punch-through" occurs is also reduced. As a result, the maximum operating voltage of the device is reduced from that which it would be if the rods were aligned perfectly parallel to each other.

SUMMARY OF THE INVENTION

An improved method of making ohmic electrical contact to a matrix of semiconductor material having conductive elements embedded therein in accordance with the present invention comprises providing a body which includes a matrix of semiconductor material having disposed therein an array of individual conductive elements of conductive material exposed at a surface of the body. Conductive material is removed from the conductive elements exposed at a selected area of the surface to form holes extending from the surface to underlying conductive material of the conductive elements. The holes are then filled with insulating material. A conductive member is formed in ohmic contact with the semiconductor material within the selected area, with the conductive member not extending through the insulating material to the underlying conductive material of the conductive elements.

In another aspect of the present invention a semiconductor device is manufactured by providing a body including a matrix of single crystal semiconductor material which has disposed therein an array of individual rods of conductive material forming rectifying barriers at the interfaces of the rods and the semiconductor material. The rods are disposed generally parallel to each other and are distributed throughout the body with one ends thereof exposed at a surface of the body. First the conductive material comprising the rods is removed from the first and second selected areas of the surface to form holes of approximately one micron in depth extending from the surface to underlying conductive material of the rods in these selected areas. These holes are then filled with insulating material. A gate contact member is formed in ohmic contact with rods exposed at a third selected area of the surface of the body which lies intermediate between the first and second selected areas. Source and drain contact members are formed in ohmic contact with semiconductor material within the first and second selected areas, respectively, with the source and drain contact members not extending through the insulating material to underlying conductive material of the rods.

A semiconductor device in accordance with the present invention comprises a body including a matrix of semiconductor material having disposed therein an array of individual rods of conductive material forming rectifying barriers at the interfaces of the rods and the semiconductor material. A first conductive contact member is in ohmic contact with a plurality of the rods at one end of each of the rods of the plurality at a surface of the body. A second conductive contact member is in ohmic contact with the semiconductor material of the matrix at the surface. The rods underlying the second conductive contact member are recessed below the surface with insulating material interposed between the rods and the second conductive contact member.

In accordance with another aspect of the present invention a field effect transistor comprises a body including a matrix of semiconductor material having disposed therein an array of individual rods and conductive material forming rectifying barriers at the interfaces of the rods and the semiconductor material. The rods are disposed generally parallel to each other and generally transverse to a surface and are distributed throughout the body. A gate contact member is in ohmic contact with a plurality of the rods at one end of each of the rods of the plurality at the surface of the body. A source contact member is in ohmic contact with the semiconductor material of the matrix at the surface, and a drain contact member is in ohmic contact with the semiconductor material of the matrix at the surface. The rods underlying the source contact member and the rods underlying the drain contact member are recessed below the surface with insulating material interposed between the rods and the source and drain contact members.

In the figures the various elements are not drawn to scale. Certain dimension are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

In carrying out the method of the present invention a body of a semiconductor-metal eutectic composite specifically a body including a matrix of silicon having disposed therein tantalum silicide ($TaSi_2$) rods is fabricated in accordance with the teachings in U.S. Pat. No. 4,724,223.

Figure 1:
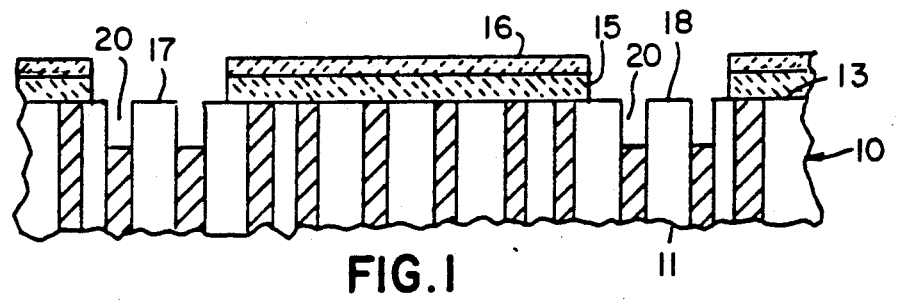
FIGS. 1–7 are a series of elevational views in crosssection of a fragment of a wafer of a semiconductor-metal eutectic composite illustrating successive stages in the fabrication of a field effect transistor in accordance with the present invention.

FIG. 1 illustrates a fragment of a wafer of such a silicon-tantalum silicide eutectic composite to be employed in accordance with the present invention in the fabrication of a field effect transistor. The body 10 consists essentially of a matrix of single crystal semiconductor material 11, specifically silicon, and an array of rods 12 of the conductive material, specifically $TaSi_2$, which forms the eutectic composition with the semiconductor material. The fragment is cut from a larger body in such a manner that the rods, which are generally parallel, lie transverse to the major upper surface 13 of the wafer. The rods 12 are not necessarily of perfectly circular cross-section nor are they necessarily perfectly parallel. The rods 12 are, however, each individual elements and do not interconnect, and the semiconductor matrix 11 is entirely interconnected and surrounds each of the individual rods.

When the body is grown, the semiconductor material is appropriately doped with conductivity type imparting material of either N- or P- type so that Schottky barriers are formed between the conductive rods 12 and the semiconductor matrix 11. In the particular instance under discussion, the silicon material is doped with phosphorus to produce N-type silicon having a carrier concentration of from $10^{14}$ to $10^{18}$ $cm^{-3}$. Generally the volume fraction of the rods 12 in the body 10 should be between 0.5 and 35%. The inter-rod spacing should be between 1 and 50 micrometers, and the rod diameter should be between 0.1 and 15 micrometers. More specifically, with a silicon-tantalum silicide eutectic composite the body is 2% by volume of conductive, metallic, $TaSi_2$, rods. The average rod diameter is 1.2 micrometers and the average inter-rod spacing is 7.9 micrometers.

In carrying out the method of the invention in the fabrication of a field effect transistor employing a body 10 of a matrix 11 of silicon with conductive rods 12 of tantalum silicide, the surface 13 of the body is coated with a layer of deposited silicon nitride 15 which is covered with a layer of deposited silicon oxide 16 and then by a layer of photoresist material. By employing known photolithographic techniques the source and drain regions of the device are patterned in the photoresist layer forming openings therethrough. The silicon oxide exposed at the openings is etched away, and the remaining photoresist layer is removed. With the remaining silicon oxide 16 acting as a mask, the silicon nitride 16 exposed through the openings in the oxide film is etched away to expose the underlying surface 13 of the wafer in selected areas 17 and 18 which define the source and drain, respectively, to be fabricated in the device (FIG. 1).

The wafer is then subjected to an etching solution of buffered hydrofluoric acid for a period of approximately one and one-half hours. This treatment etches the $TaSi_2$ of the rods in the exposed areas 17 and 18 to form holes 20 having a depth of approximately 1 to 2 micrometers. FIG. 1 illustrates the wafer at this stage.

Figure 2:
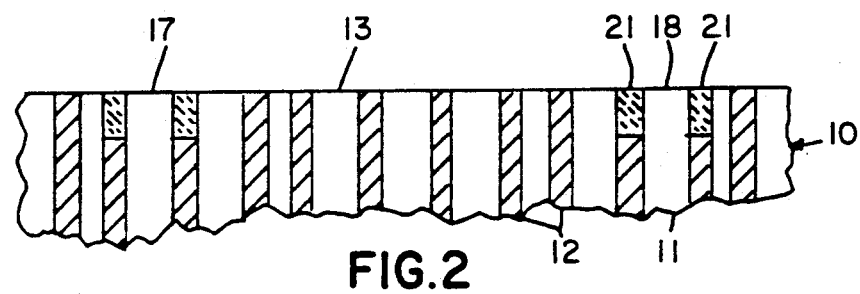

Pure polycrystalline silicon 21 is then deposited on the wafer in order to fill the openings or holes 20 formed by the removed portions of the rods 12. The surface of the wafer is then coated with a resist material and the wafer is treated in a plasma etching system to remove all the material from the surface of the wafer and to produce a flat, smooth, contiguous surface 13. As illustrated in FIG. 2 the rods 12 in the selected areas 17 and 18 are recessed below the surface 13 and the intervening spaces are filled with resistive polycrystalline silicon 21.

Figure 3:
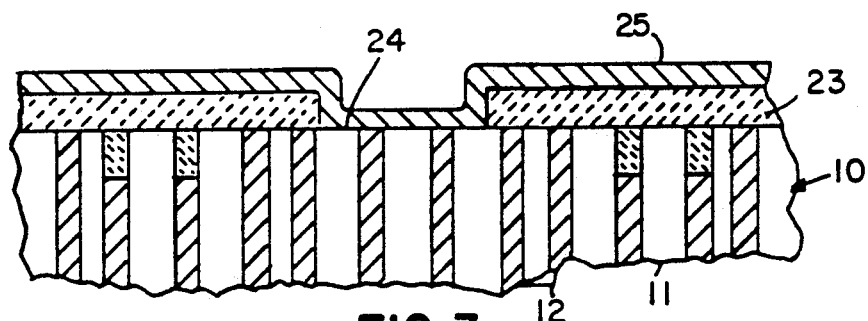
Figure 4:
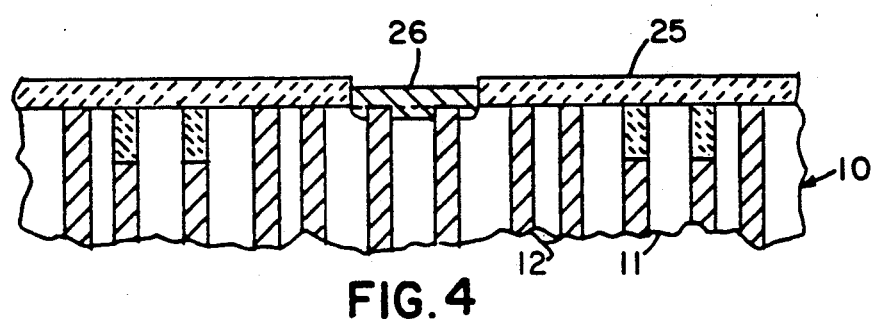

Next, a layer of silicon oxide 23 is deposited over the surface of the wafer. A photoresist layer is deposited over the oxide layer 23, and using known photolithographic techniques an opening 24 is formed in the oxide layer 23 to define the gate region of the device as illustrated in FIG. 3. A cobalt disilicide gate contact member is formed to the ends of the rods 12 exposed at the opening 24 in the oxide layer 23 by employing the technique described in U.S. Pat. No. 4,724,223. A layer of cobalt 25 is deposited over the surface of the wafer and the oxide layer 23. Then the wafer is subjected to a rapid thermal annealing treatment which causes the silicon in contact with the cobalt to form a cobalt disilicide contact member 26. The member 26 is in good ohmic contact with the underlying $TaSi_2$ rods and also forms a rectifying contact with the silicon of the matrix. The unreacted cobalt is removed in a suitable etching solution which does not attack the cobalt disilicide contact member. The device at this stage is illustrated in FIG. 4.

Figure 5:
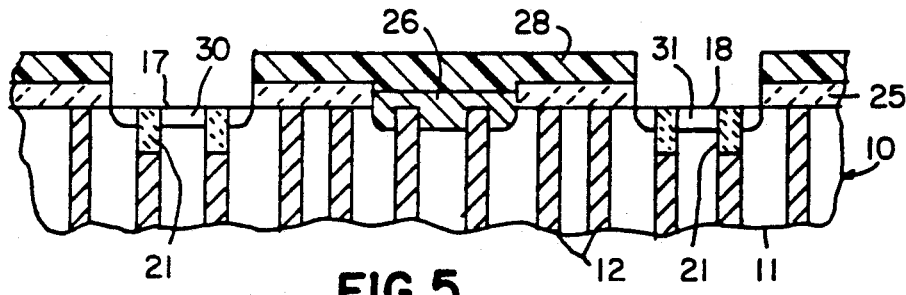

Next, the wafer is coated with a layer of a photoresist material 28 and openings are formed in the photoresist layer 28 and the oxide layer 25 to expose the surface areas 17 and 18 for the source and drain regions (FIG. 5). The wafer is treated by ion implanting a suitable doping material into the exposed source and drain regions 30 and 31 with the photoresist layer 28 protecting the remainder of the wafer. Specifically, phosphorous is implanted in order to produce heavily-doped, low resistivity N-type regions 30 and 31 in the high resistivity N-type silicon matrix. After the ion implantation procedure, the photoresist material is removed and the wafer is subjected to a rapid thermal annealing treatment in order to activate the ion implanted phorphorus. As illustrated in FIG. 5, the heavily-doped source and drain regions 30 and 31 do not extend to the uppermost portions of the rods 12 which are recessed below the surface, and polycrystalline silicon 21 lies interposed between the rods and the source and drain regions.

Figure 6:
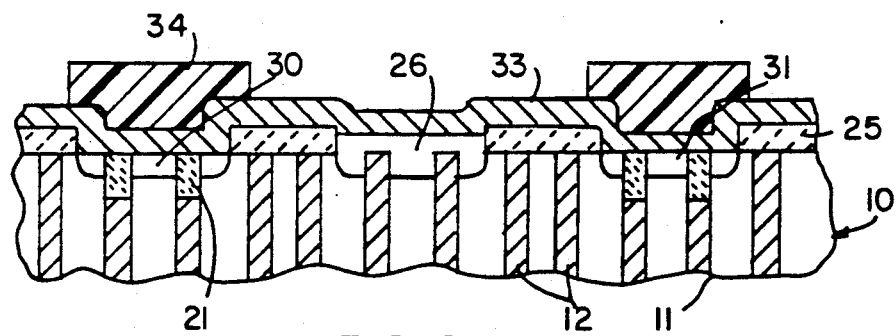

The wafer is then treated in accordance with known procedures to produce ohmic contact members to the source and drain regions. A layer of titanium-tungsten alloy (Ti/W) is deposited over the entire wafer followed by a layer of aluminum (Al). Photoresist material 34 is applied over the Ti/W-Al metallization 33. The photoresist material is removed except over the source and drain regions 30 and 31 as illustrated in FIG. 6. Then the wafer is treated to etch away the exposed Al and then the underlying exposed Ti/W. The resulting source and drain contact members 33A and 33B as illustrated in FIG. 7 are in direct ohmic contact with the source and drain regions 30 and 31.

Figure 7:
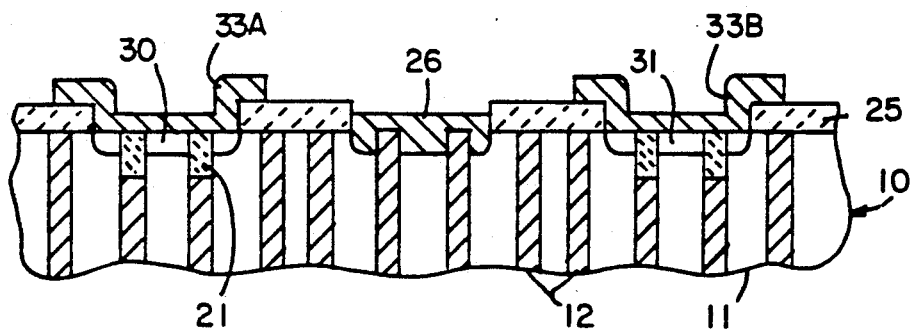

The device structure as illustrated in FIG. 7 employs a body which includes a matrix of silicon 11 having $TaSi_2$ rods 12 disposed throughout. The source and drain contact members 33A and 33B make contact only to the silicon of the matrix and not to any of the rods. The gate contact of cobalt disilicide 26 makes ohmic contact to the underlying rods 12 and rectifying contact to the surface of the silicon matrix 11.

The ohmic contacts for the source and drain are only to silicon and not to any of the rods. Thus, any problems caused by some rods being, in effect, part of the source and drain contacts are completely eliminated, producing a higher maximum blocking voltage and permitting a theoretical higher maximum operating voltage.

While there has been shown and described what is considered a preferred embodiment of the present invention, it will be obvious to those skilled in the art that various changes and modifications may be made therein without departing from the invention as defined by the appended claims.

What is claimed is:

1. The method of making ohmic electrical contact to a matrix of semiconductor material having conductive elements embedded therein comprising providing a body including a matrix of single crystal semiconductor material having disposed therein an array of individual rods of conductive material forming rectifying barriers at the interfaces of the rods and the semiconductor material, said rods being disposed generally parallel to each other and being distributed throughout said body with one ends thereof being exposed at a surface of said body;

removing conductive material from conductive elements exposed at a selected area of said surface to form holes extending from said surface to underlying conductive material of said conductive elements in said selected area;

filling said holes with insulating material; and forming a conductive member in ohmic contact with semiconductor material within said selected area, said conductive member not extending through said insulating material to said underlying conductive material of said conductive elements.

2. The method in accordance with claim 1 wherein the conductive material of said rods is a conductive compound of a metal and the semiconductor material of the matrix.

3. The method in accordance with claim 2 wherein said semiconductor material is silicon.

4. The method in accordance with claim 3 wherein said insulating material is polycrystalline silicon.

5. The method in accordance with claim 4 wherein the conductive material of said rods is a conductive compound of a metal and silicon.

6. The method in accordance with claim 5 wherein the mole ratio of silicon to the metal in the matrix and array of rods is approximately equal to the mole ratio of silicon to the metal in the eutectic composition of silicon and the conductive compound.

7. The method in accordance with claim 6 wherein the volume fraction of the array of rods of the conductive compound of the metal in the body is from 0.5 to 35 percent.

8. The method in accordance with claim 7 wherein the diameter of each of said rods is from 0.1 to 15 micrometers; and the spacing between adjacent rods is from 1 to 50 micrometers.

9. The method in accordance with claim 8 including prior to forming a conductive member in ohmic contact introducing conductivity type imparting material into the body at said selected area to decrease the resistivity of the underlying zone of semiconductor material, said zone not extending through said insulating material to said underlying conductive material.

10. The method of manufacturing a semiconductor device comprising providing a body including a matrix of single crystal semiconductor material having disposed therein an array of individual rods of conductive material forming rectifying barriers at the interfaces of the rods and the semiconductor material, said rods being disposed generally parallel to each other and being distributed throughout said body with one end thereof being exposed at a surface of said body;

removing conductive material from rods exposed at spaced apart first and second selected areas of said surface to form holes extending from said surface to underlying conductive material of said rods in said selected areas; and filling said holes with insulating material;

forming a gate contact member in ohmic contact with rods exposed at a third selected area of said surface lying intermediate between said first and second selected areas; and forming source and drain contact members in ohmic contact with semiconductor material within said first and second selected areas, respectively; said source and drain contact members not extending through said insulating material to said underlying conductive material of said rods.

11. The method in accordance with claim 10 wherein the conductive material of said rods is a conductive compound of a metal and the semiconductor material of the matrix.

12. The method in accordance with claim 11 wherein said semiconductor material is silicon.

13. The method in accordance with claim 12 wherein said insulating material is polycrystalline silicon.

14. The method in accordance with claim 13 wherein the conductive material of said rods is a conductive compound of a metal and silicon.

15. The method in accordance with claim 14 including prior to forming source and drain contact members the body at said first and second selected area to decrease the resistivity of the underlying zones of semiconductor material, said zone not extending through said insulating material to said underlying conductive material.

16. The method in accordance with claim 15 wherein the mole ratio of silicon to the metal in the matrix and array of rods is approximately equal to the mole ratio of silicon to the metal in the eutectic composition of silicon and the conductive compound.

17. The method in accordance with claim 16 wherein the volume fraction of the array of rods of the conductive compound of the metal in the body is from 0.5 to 35 percent.

18. The method in accordance with claim 17 wherein the diameter of each of said rods is from 0.1 to 15 micrometers; and the spacing between adjacent rods is from 1 to 50 micrometers.

* * * * *